United States Patent
Naitou et al.

(10) Patent No.: US 6,800,425 B2
(45) Date of Patent: Oct. 5, 2004

(54) PROCESS OF PRODUCING POLYMER OPTICAL WAVEGUIDE

(75) Inventors: Ryuusuke Naitou, Ibaraki (JP); Amane Mochizuki, Ibaraki (JP); Kazunori Mune, Ibaraki (JP); Naoki Sadayori, Ibaraki (JP); Takahiro Fukuoka, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 53 days.

(21) Appl. No.: 10/616,983

(22) Filed: Jul. 11, 2003

(65) Prior Publication Data

US 2004/0013816 A1 Jan. 22, 2004

(30) Foreign Application Priority Data

Jul. 17, 2002 (JP) .................................... P. 2002-208428
Mar. 5, 2003 (JP) .................................... P. 2003-059233

(51) Int. Cl.[7] ................................................ G02B 6/13
(52) U.S. Cl. ........................ 430/321; 385/143; 385/145
(58) Field of Search ............................... 385/129, 130, 385/131, 132, 143, 145; 430/321

(56) References Cited

U.S. PATENT DOCUMENTS

| | | | | |
|---|---|---|---|---|
| 5,292,620 A | * | 3/1994 | Booth et al. ................ | 430/290 |
| 5,449,742 A | | 9/1995 | Beuhler et al. | |
| 2002/0172492 A1 | * | 11/2002 | Shelnut et al. .............. | 385/143 |

FOREIGN PATENT DOCUMENTS

| | | |
|---|---|---|
| JP | 2002-71987 A | 3/2002 |
| JP | 2002-356615 A | 12/2002 |

OTHER PUBLICATIONS

Computer–generated translation of JP 2002–356615, Kazunori et al., Dec. 2002.*
Patent Abstracts of Japan—2001 022063 (2001).
Patent Abstracts of Japan—59 024806 (1984).
Patent Abstracts of Japan—10 239546 (1998).
Patent Abstracts of Japan—02 201322 (1990).
European Search Report dated Nov. 14, 2003.

* cited by examiner

Primary Examiner—John A. McPherson
(74) Attorney, Agent, or Firm—Sughrue Mion, PLLC

(57) ABSTRACT

A process of producing a polymer optical waveguide, including (a) a step of forming an undercladding layer on a substrate; (b) a step of forming a photosensitive resin composition layer containing a 1,4-dihydropyridine derivative and a resin on the undercladding layer; (c) a step of irradiating a region of the photosensitive resin composition layer corresponding to a core pattern with UV light through a mask to form UV light-exposed areas and UV light-unexposed areas on the photosensitive resin composition layer; (d) a step of heating the UV light-exposed areas and UV light-unexposed areas of the photosensitive resin composition layer; and (e) a step of forming an overcladding layer on the photosensitive resin composition layer after heating.

5 Claims, 2 Drawing Sheets

PROCESS OF PRODUCING POLYMER OPTICAL WAVEGUIDE

FIELD OF THE INVENTION

The present invention relates to a process of producing a polymer optical waveguide that can be suitably used in optical circuits, optical switches, optical multiplexers/demultiplexers, etc.

DESCRIPTION OF THE RELATED ART

With the progress of practical application of optical communication system by development of optical fibers, development of various optical communication devices using an optical waveguide structure is demanded. In general, optical waveguide materials are required to have characteristics such that they have a low light propagation loss, have heat resistance and humidity resistance, and can control a refractive index and a film thickness. In recent years, use of synthetic resins as the optical waveguide materials is investigated. Of a number of synthetic resins, polyimide resins have the highest heat resistance and therefore, recently attract a great deal of attention.

Hitherto, optical circuits comprising a polyimide resin have been generally formed by the following dry process. That is, a polyamic acid as a polyimide resin precursor is first dissolved in a polar solvent such as N,N-dimethylacetamide and N-methyl-2-pyrrolidone, to prepare a polyamic acid varnish; the varnish is coated on a substrate by spin coating or casting; the coated varnish is heated to not only remove the solvent but also cyclize the polyamic acid for imidation, thereby forming a polyimide resin film; and the polyimide resin film is then subjected to reactive ion etching (RIE) with oxygen plasma, etc., to form a pattern as an optical circuit on the polyimide resin film.

However, according to such a conventional dry process, not only it takes a long period of time to form an optical circuit, but also the problem of realizing a reduction of the production cost is not yet solved because the processing region is restricted. Further, according to such a dry process, since a wall surface (side surface) of the formed pattern is not flat, there is a problem such that a scattering loss becomes large during wave guiding of a light into the optical circuit.

On the other hand, a method of forming a pattern by a wet process of a photosensitive polyimide resin precursor composition, i.e., a photosensitive polyamic acid resin composition, namely a method in which a region of a photosensitive polyamic acid resin composition layer corresponding to a required pattern is irradiated with UV light and then developed to obtain a pattern corresponding to the UV light-irradiated areas, is also known (see, for example, JP-A-2-201322).

For preparing an optical waveguide utilizing this method, for example, an undercladding layer 2 is formed on a substrate as shown in FIG. 1A; a photosensitive polyamic acid resin composition layer 3 is formed on the undercladding layer 2 as shown in FIG. 1B; and the photosensitive polyamic acid resin composition layer 3 is then irradiated with UV light through a glass mask 4 so as to obtain a required pattern as shown in FIG. 1C. The photosensitive polyamic acid resin composition layer is then treated with a developing solution to leave UV light-exposed areas and remove UV light-unexposed areas, thereby forming a core layer 5 having the required pattern on the undercladding layer 2 as shown in FIG. 1D. Subsequently, an overcladding layer 6 is formed on such a core pattern to obtain a channel type optical waveguide as shown in FIG. 1E.

According to the wet process including UV light irradiation of a photosensitive polyamic acid resin composition and a subsequent development step, although the wet process is free from the above-described problems in the dry process, the wet process involves a new problem with respect to a pattern obtained. That is, according to the wet process including a development step, since circulation of a developing solution varies depending on the shape of an etching tank and the pattern of an actual sample so that the patterning property is greatly influenced, it is difficult to obtain a desired pattern with high precision and good reproductivity. Further, there may be the case where impurities in the developing solution adhere to the desired pattern, leading to partial etching failure.

In addition, according to the foregoing wet processing including a development step, since the UV light-unexposed areas are removed to form a core layer corresponding to the UV light-exposed areas, when the overcladding layer is formed on the core pattern, another problem involves such that a difference in level based on the core layer must be made uniform to flatten the surface of the overcladding layer. Especially, in the case where an overcladding layer comprising a polyimide is formed on the core layer, since the polyimide is in general formed by coating a solution of a polyamic acid as its precursor on a pattern, heating and then curing (imidating), shrinkage in volume by volatilization of a solvent as used is large so that it is difficult to make a difference in level ranging from about 5 to 10 $\mu$m as formed by the core layer uniform to flatten the surface of the overcladding surface.

Also, a process of producing a polymer optical waveguide by a wet process not including a development step is already known. That is, this process comprises applying a heat/UV-light curable resin with a high refractive index containing a photopolymerization initiator and a heat polymerization initiator on a substrate to form a resin layer; irradiating the resin layer with light to undergo crosslinking to form a core portion; heating the resin layer to undergo heat curing of UV light-unexposed areas to form a cladding portion comprising a thermosetting resin with a lower refractive index on the side surfaces of the core portion; and further forming an upper cladding portion on the resin layer comprising a core portion and a cladding portion, to produce an optical waveguide (see JP-A-2002-71987).

According to such a process, nevertheless the wet process, it does not include a development step. Accordingly, the process is free from the above-described problems. On the other hand, since a resin to be used must have photopolymerization property and heat polymerization property, resins that are to be used are very restricted.

SUMMARY OF THE INVENTION

As a result of extensive and intensive investigations to overcome the above-described problems in the conventional production of polymer optical waveguides by a wet process, it has been found that when a 1,4-dihydropyridine derivative as a photosensitive compound is compounded with an arbitrary resin to form a photosensitive resin composition, which is then irradiated with light and heated, a residual component of a decomposition product of the 1,4-dihydropyridne derivative and its amount influence a refractive index of a resin layer, resulting in enabling to make an effective difference in refractive index between exposed areas and unexposed areas of the resin composition layer and that nevertheless a wet process not including a development step, a polymer optical waveguide structure can be thus formed using an arbitrary resin. The present invention has been completed based on this finding.

Accordingly, an object of the invention is to provide a process of producing a polymer optical waveguide, in which nevertheless a wet process not including a development step, an overcladding layer can be formed in a flat shape on a core layer, and a resin to be used can be freely chosen.

Specifically, the invention provides a process of producing a polymer optical waveguide, which comprises:

(a) a step of forming an undercladding layer on a substrate;

(b) a step of forming a photosensitive resin composition layer containing a 1,4-dihydropyridine derivative and a resin on the undercladding layer;

(c) a step of irradiating a region of the photosensitive resin composition layer corresponding to a core pattern with UV light through a mask to form UV light-exposed areas and UV light-unexposed areas on the photosensitive resin composition layer;

(d) a step of heating the UV light-exposed areas and UV light-unexposed areas of the photosensitive resin composition layer; and (e) a step of forming an overcladding layer on the photosensitive resin composition layer after heating.

DETAILED DESCRIPTION OF THE INVENTION

Figure 1A:
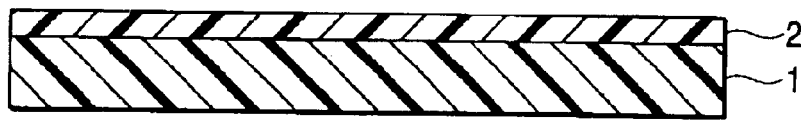
FIG. 1A to FIG. 1E show the conventional production steps of an channel type optical waveguide using a photosensitive polyimide resin precursor composition, including a development step.
Figure 1B:
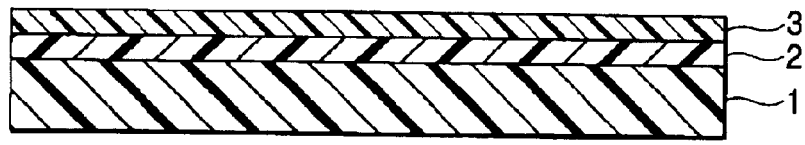
Figure 1C:
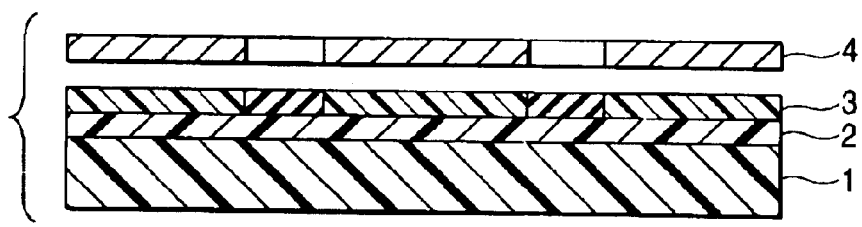
Figure 1D:
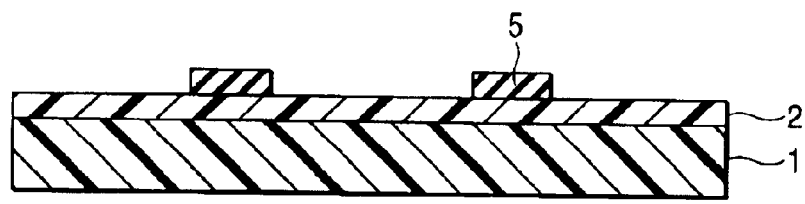
Figure 1E:
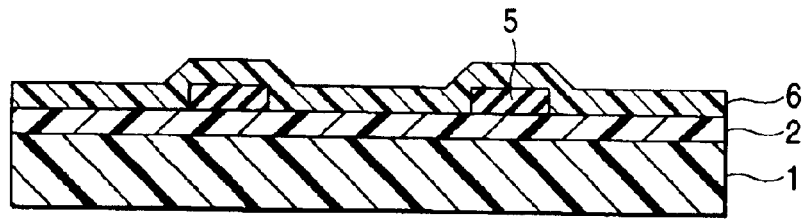

As described later, in the process according to the invention, a 1,4-dihydropyridine derivative as a photosensitive compound is compounded with a resin to form a photosensitive resin composition, and the photosensitive resin composition is irradiated with UV light and then heated to make an effective difference in refractive index between exposed areas and unexposed areas of the resin layer, thereby forming a core layer and a cladding layer. Therefore, the resin used is not particularly limited.

Examples of resins that can be used in the invention include polycarbonates, methacrylate based resins (such as polymethyl methacrylate), polyester based polyester resins (such as polyethylene terephthalate), polyether sulfones, polynorbomenes, epoxy based resins, polyaryls, polyimides, polycarbodiimides, polyether imides, polyamide-imides, polyester imides, polyamides, styrene based resins (such as polystrenes, acrylonitrile-styrene copolymers and acrylonitrile-butadiene-styrene copolymers), polyarylene ethers (such as polyphenylene ether), polyallylates, polyacetals, polyphenylene sulfides, polysulfones, polyether ketones (such as polyetheretherketones and polyetherketoneketones), polyvinyl alcohols, and polyvinylpyrrolidones. Further, fluorocarbon resins such as vinylidene fluoride based resins, hexafluoropropylene based resins, and hexafluoroacetone based resins can also be used.

These resins may contain polysilane based polymers such as polysilanes. When such a polysilane based polymer is compounded with the resin, mechanical characteristics of the resin are enhanced. Examples of such polysilane based polymers include poly(alkylsilanes) such as polysilanes, poly(alkylcycloalkylsilanes) such as poly (methylcyclohexylsilane), poly(alkylarylsilanes) such as poly(methylphenylsilane), and poly(arylarylsilanes) such as poly(diphenylsilane).

Of the above various resins, polyimides, polyamides, polyamide-imides, polyether imides, polyether ketones, epoxy based resins, polycarbodiimides, fluorocarbon resins, and polysilane based resins are particularly preferably used because of their excellent heat resistance. Further, from the standpoint of transparency, resins containing fluorine in the molecule, such as fluorinated polyimides, fluorinated epoxy resins, and fluorocarbon resins, are preferably used.

Especially, polyimides and polycarbodiimides, which contain a fluorine atom in the molecule, capable of providing optical waveguides having excellent heat resistance and excellent performance are the most preferable as the resin. The preparation of the polymer optical waveguide comprising a polyimide or a polycarbodiimide as the resin according to the invention is described below.

First of all, for preparing an optical waveguide comprising a polyimide according to the invention, a 1,4-dihydropyridine derivative is compounded with a polyamic acid to form a photosensitive polyamic acid resin composition, a core layer and a cladding layer are formed on a substrate using this photosensitive polyamic acid resin composition, and an overcladding is further formed thereon.

The photosensitive polyamic acid resin composition comprising a polyamic acid as a resin component comprises:

(i) 100 parts by weight of a polyamic acid obtained from a tetracarboxylic dianhydride and a diamine; and (ii) from 0.01 to less than 10 parts by weight of a photosensitive compound comprising a 1,4-dihydropyridine derivative represented by the following formula (I):

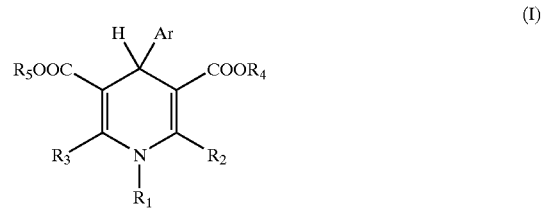

wherein Ar represents an aromatic having a nitro group at the ortho-position with respect to the bonding position to the 1,4-dihydropyridine ring; $R_1$ represents a hydrogen atom or an alkyl group having from 1 to 3 carbon atoms; and $R_2$, $R_3$, $R_4$, and $R_5$ each independently represent a hydrogen atom or an alkyl group having 1 or 2 carbon atoms.

In the invention, the tetracarboxylic acid dianhydride is not particularly limited, but examples thereof include pyromellitic dianhydride, 3,3',4,4'-biphenyltetracarboxylic dianhydride, 2,2-bis(2,3-dicarboxyphenyl)propane dianhydride, 2,2-bis(3,4-dicarboxyphenyl)propane dianhydride, 3,3',4,4'-benzophenonetetracrboxylic dianhydride, bis(3,4-dicarboxylphenyl)ether dianhydride, and bis(3,4-dicarboxyphenyl)sulfonic dianhydride.

The tetracarboxylic dianhydride preferably has a fluorine atom in the molecule (hereinafter referred to as "fluorine-substituted tetracarboxylic dianhydride"). Examples of the fluorine-substituted tetracarboxylic dianhydride include 2,2-bis(3,4-dicarboxy-phenyl)hexafluoropropane dianhydride, 4,4-bis(3,4-dicarboxytrifluorophenoxy)-tetrafluorobenzene dianhydride, 1,4-bis(3,4-dicarboxytrifluorophenoxy)-tetrafluorobenzene dianhydride, (trifluoromethyl)pyromellitic dianhydride, di(trifluoromethy)pyromellitic dianhydride, and di(heptafluoropropyl)pyromellitic dianhydride.

Examples of the diamine include m-phenylenediamine, p-phenylenediamine, 3,4'-diaminodiphenyl ether, 4,4'-diaminodiphenyl ether, 4,4'-diaminodiphenylsulfone, 3,3'-diaminodiphenylsulfone, 2,2-bis(4-aminophenoxyphenyl)propane, 1,3-bis(4-aminophenoxyl)benzene, 1,4-bis(4-aminophenoxy)benzene, 2,4-diaminotoluene, 2,6-diaminotoluene, 4,4'-diaminodiphenylmethane, and 4,4'-diamino-2,2'-diphenylbiphenyl.

Similar to the tetracarboxylic acid dianhydride, the diamine preferably has a fluorine atom in the molecule (hereinafter referred to as "fluorine-substituted diamine"). Examples of the fluorine-substituted diamine include 2,2'-bis(trifluoromethoxy)-4,4'-diaminobiphenyl (TFMOB), 3,3'-diamino-5,5'-bis(trifluoromethyl)biphenyl, 2,2-bis(4-aminophenyl)hexafluoropropane (BAAF), 2,2-bis[4-(4-aminophenoxy)-phenyl]hexafluoropropane (HFBAPP), 2,2'-bis(trifluoromethyl)-4,4'-diaminobiphenyl (TFMB), 2,2-bis(3-amino-4-hydroxyphenyl)hexafluoropropane (BIS-AP-AF), 2,2-bis(3-amino-4-methylphenyl)hexafluoropropane (BIS-AT-AF), 2,2'-difluorobenzidine (FBZ), 4,4'-bis(aminooctafluoro)biphenyl, 3,5-diaminobenzotrifluoride, and 1,3-diamino-2,4,5,6-tetrafluorobenzene.

The polyamic acid can be obtained by reacting the tetracarboxylic acid dianhydride and diamine in a conventional manner. That is, for example, the diamine is dissolved in a proper organic solvent under a nitrogen atmosphere, the tetracarboxylic acid dianhydride in an amount equimolar with the diamine is added to the resulting solution, and the resulting mixture is stirred at room temperature for from about 5 to 20 hours, whereby a solution of the polyamic acid can be obtained as a viscous solution.

As the solvent, any solvents that have conventionally been used for the production of polyamic acids can be used without particular limitations, but polar solvents such as N,N-dimethylacetamide (DMAc) and N-methyl-2-pyrrolidone (NMP) are preferably used. Especially, DMAc is preferably used because it does not cause heat decomposition and has superior transparency.

According to the invention, a polyimide resin obtained by using a polyamic acid having a repeating unit represented by the following formula (II):

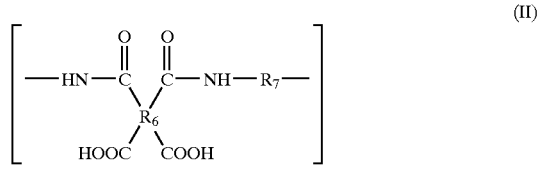

(II)

wherein $R_6$ represents at least one tetravalent group selected from the group consisting of tetravalent groups represented by the following formulae (IIa), (IIb), (IIc) and (IId):

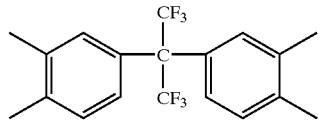

(IIa)

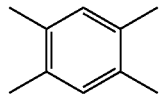

(IIb)

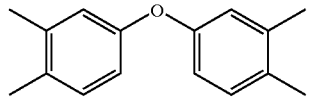

(IIc)

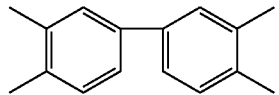

(IId)

and $R_7$ represents at least one divalent group selected from the group consisting of divalent groups represented by the following formulae (IIe), (IIf), (IIg) and (IIh):

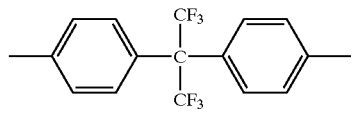

(IIe)

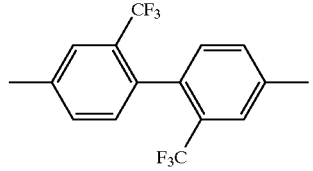

(IIf)

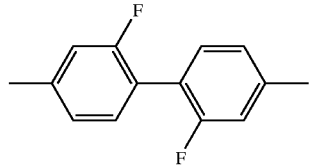

(IIg)

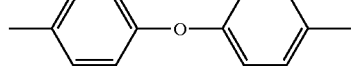

(IIh)

is preferable because it has a low refractive index. Further, in the case where this polyimide resin is used as a core layer of an optical waveguide, it is easy to regulate a relative refractive index difference to a clad.

The photosensitive polyamic acid resin composition comprising a polyamic acid as the resin component comprises 100 parts by weight of the polyamic acid and 0.01 to less than 10 parts by weight of, as a photosensitive compound, a 1,4-dihydropyridine derivative represented by the following formula (I):

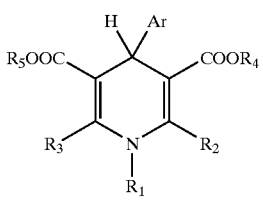

(I)

wherein Ar represents an aromatic group having a nitro group at the ortho-position with respect to the binding position to the 1,4-dihydropyridine ring; $R_1$ represents a hydrogen atom or an alkyl group having from 1 to 3 carbon atoms; and $R_2$, $R_3$, $R_4$, and $R_5$ each independently represent a hydrogen atom or an alkyl group having 1 or 2 carbon atoms.

Specific examples of the photosensitive compound include 1-ethyl-3,5-dimethoxycarbonyl-4-(2-nitrophenyl)-1,4-dihydropyridine, 1-methyl-3,5-dimethoxycarbonyl-4-(2-nitrophenyl)-1,4-dihydropyridine, 1-propyl-3,5-dimethoxy-carbonyl-4-(2-nitrophenyl)-1,4-dihydropyridine, and 1-propyl-3,5-diethoxycarbonyl-4-(2-nitrophenyl)-1,4-dihydropyridine.

Of the above various photosensitive compounds, 1-ethyl-3,5-dimethoxycarbonyl-4-(2-nitrophenyl)-1,4-dihydropyridine (hereinafter referred to as "EDHP") is preferably used from the standpoints of a low cost and low light absorption by C—H bond.

Such a 1,4-dihydropyridine derivative can be obtained by, for example, reacting a substituted benzaldehyde, two molar times of an alkyl propiolate (propargylic acid alkyl ester), and a corresponding primary amine in glacial acetic acid under reflux conditions (*Khim. Geterotsikl. Soed.*, pp. 1067–1071, 1982).

The photosensitive compound is used in an amount of from 0.01 to less than 10 parts by weight, and preferably from 0.1 to 5 parts by weight, per 100 parts by weight of the polyamic acid. If the photosensitive resin composition is prepared using the photosensitive compound in an amount of 10 parts by weight or more per 100 parts by weight of the polyamic acid, the resulting polyimide resin causes light absorption in a near infrared light region. On the other hand, if the compounding amount of the photosensitive compound is less than 0.01 parts by weight per 100 parts by weight of the polyamic acid, even when the resulting photosensitive resin composition is irradiated with UV light, it is impossible to give a difference in refractive index so as to enable to prepare an optical waveguide structure between exposed areas and unexposed areas.

As described above, by introducing a fluorine atom into the structure of the polyamic acid, the transparency of the polyamic acid is enhanced. As a result, even when the proportion of the photosensitive compound to the polyamic acid is reduced, and further, the exposure amount is also reduced, a sufficient sensitivity to light is attained, and after exposure, effective difference between exposed areas and unexposed areas can be given.

That is, by introducing a fluorine atom into the structure of the polyamic acid, the exposure amount for exposing the photosensitive resin composition can be reduced as compared with that in photosensitive resin compositions comprising the conventional polyamic acid as the resin component. In other words, in photosensitive resin compositions comprising the conventional polyamic acid as the resin component, a proper exposure amount is from 300 to 1,000 mJ/cm². On the other hand, according to the photosensitive resin composition in which a fluorine atom is introduced into the structure of the polyamic acid, it is possible to attain sufficient resolution by an exposure amount in the range of from 5 to 20 mJ/cm².

According to the invention, after forming an undercladding layer on an appropriate substrate, preferably a photosensitive resin composition comprising the above-described photosensitive compound compounded with a polyamic acid having a fluorine atom introduced in the structure thereof is applied to the undercladding layer and dried to form a photosensitive resin composition layer; a region of the photosensitive resin composition layer corresponding to a required core pattern is irradiated with UV light through a mask to form UV light-exposed areas and UV light-unexposed areas corresponding to the core pattern on the photosensitive resin composition layer; thereafter, both the UV light-exposed areas and the UV light-unexposed areas of the photosensitive resin composition layer are heated to undergo imidation, thereby forming a polyimide layer containing a core layer comprising a polyimide of the UV light-exposed areas and a cladding layer comprising a polyimide of the UV light-unexposed areas; and an overcladding layer is further formed on the polyimide layer, thereby obtaining a polyimide optical waveguide.

In the case where an undercladding layer is formed, a polyimide layer containing a core layer and a cladding layer is formed on the undercladding layer, and an overcladding layer is further formed on the polyimide layer to form a channel type optical waveguide structure as described above, a refractive index of the cladding layer in the circumference of the core layer must be lower than that of the core layer. From the standpoint of contrast property, it is preferred that the refractive indexes of the circumferential clads are all identical. Accordingly, for example, the overcladding layer and the undercladding layer can be formed from the same polyimide.

The production process of a polymer optical waveguide according to the invention will be hereunder described in detail with reference to the case of using a photosensitive polyamic acid resin composition comprising a polyamic acid as the resin composition.

As a first step (a), an undercladding layer is formed on an appropriate substrate. For example, this undercladding layer may be formed from a polyimide in a conventional manner. In this case, a polyimide used and a formation method are not particularly limited. The photosensitive polyamic acid resin composition described above may be applied to the substrate and dried, and then heated and cured (imidated) as it is without being exposed, to form the undercladding layer. The heating (imidation) temperature is generally in a range of from 300 to 400° C., and the polyamic acid is cured while desolvating in vacuo or in a nitrogen atmosphere.

As the substrate, conventional substrates are appropriately used. Examples of the substrates that can be used include silicone substrates, quartz substrates, metal foils, glass sheets, and polymeric films. However, the substrates used in the invention should not be limited to those.

As a second step (b), the photosensitive polyamic acid resin composition is applied to the undercladding layer and dried to form a photosensitive polyamic acid resin composition layer. A method of applying the photosensitive polyamic acid resin composition to the substrate surface is not particularly limited. For example, general film-forming methods such as spin coating and casting can be employed.

As a third step (c), a region of the photosensitive polyamic acid resin composition layer corresponding to a required core pattern is irradiated with UV light through a mask.

Irradiation means of UV light can use conventional high pressure mercury vapor lamps that are generally used for UV light irradiation of photosensitive resins.

By adjusting the amount of the photosensitive compound to be compounded with the polyamic acid within a range of from 0.01 to less than 10 parts by weight, it is possible to adjust a difference in refractive index after heating and curing (imidating) exposed areas and unexposed areas of the resulting photosensitive polyamic acid resin composition. That is, the higher the amount of the photosensitive compound to be compounded with the polyamic acid, the larger the refractive index of the exposed areas after heating and curing (imidating) is. Further, since easiness of volatilization of the residual photosensitive compound (decomposition product) of the exposed areas differs from easiness of volatilization of the residual photosensitive compound (decomposition product) of the unexposed areas, it is possible to make the both have a difference in the residual amount from each other by changing the heat profile in the heating and curing (imidating) step. As a result, it is possible to have an effective difference in refractive index.

As a fourth step (d), both the UV light-exposed areas and the UV light-unexposed areas of the photosensitive polyamic acid resin composition are heated and cured (imidated) to form a polyimide layer having a core layer comprising a polyimide of the UV light-exposed areas and a cladding layer comprising a polyimide of UV light-unexposed areas corresponding to the core pattern. When the core layer and the cladding layer are thus formed according to the invention, the core layer has a refractive index higher than the cladding layer.

According to the invention, a region of the photosensitive polyamic acid resin composition corresponding to the core pattern is irradiated with UV light and heated and cured (imidated) together with the UV light-unexposed areas. That is, since the UV light-unexposed areas are heated and cured (imidated) as they are without being removed, together with the UV light-exposed areas, a difference in level by the core layer as in the conventional wet process is not formed, but the polyimide layer having a core layer and a cladding layer has a flat surface.

As described above, the heating (imidation) temperature of the polyamic acid is generally in a range of from 300 to 400° C., and the polyamic acid is cured while desolvating in vacuo or in a nitrogen atmosphere. The film thickness of the thus formed polyimide resin can be controlled by the solids content concentration and viscosity of the photosensitive polyamic acid resin composition and the film-forming condition.

As a fifth step (e), an overcladding layer is formed on the polyimide layer having a core layer and a cladding layer. For example, this overcladding layer may be formed from a polyimide in a conventional manner as in the undercladding layer. In this case, in particular, a polyimide to be used and a formation method are not particularly limited. However, similar to the case of the undercladding layer, the photosensitive polyamic acid resin composition may be applied to the substrate and dried, and then heated and cured (imidated) as it is without being exposed, to form the overcladding layer.

In the production process of an optical waveguide using the photosensitive polyamic acid resin composition comprising a polyamic acid as the resin component, residual components of a decomposition product of the photosensitive compound remaining in the photosensitive resin after the UV light irradiation and amounts thereof influence a refractive index of the polyimide after heating and curing (imidation) of this layer. That is, the photosensitive compound in unexposed areas volatilizes at a temperature of, for example, about 200° C., whereas the photosensitive compound in exposed areas merely partially volatilizes even at a temperature of, for example, about 300° C. Thus, according to the invention, during heating and curing (imidation) to be carried out after irradiating the photosensitive polyamic acid resin composition layer with UV light, the residual amount of the decomposition product of the photosensitive compound in the resulting polyimide film can be adjusted by regulating the heating temperature or temperature elevation rate, thereby a desired difference in refractive index between the exposed areas and the unexposed areas can be obtained.

Further, when the UV light-unexposed areas of the photosensitive polyamic acid resin composition layer are heated and cured (imidated), the photosensitive compound is heat decomposed, and the decomposition product is fixed in the resin by removal of the solvent from the layer, whereby reactivity as the photosensitive compound is lost. Thus, in the post step, whatever a cladding layer formed corresponding to the UV light-unexposed areas is irradiated with UV light, this cladding layer is inactive against UV light. This point is different from that in conventional resists.

For making the circumference of the core, i.e., a clad, uniform, it is practically advantageous for the overcladding layer formed on the polyimide layer as a primary layer having an undercladding layer and a core layer to use the same material as in the core layer. That is, the same photosensitive polyamic acid resin composition are used for all of the core layer and the cladding layers, and only a region where a core pattern is formed is irradiated with UV light and then heated and cured (imidated). However, if desired, resins other than polyimides, such as epoxy resins and polycarbonate resins, can also be used for the overcladding layer.

The production process of a polyimide optical waveguide according to the invention will be described below based on the drawing with reference to a channel type optical waveguide as one example of optical waveguides.

Figure 2A:
FIG. 2A to FIG. 2E show the production steps of an channel type optical waveguide using a photosensitive polyimide resin precursor composition not including a development step according to the invention.
Figure 2B:
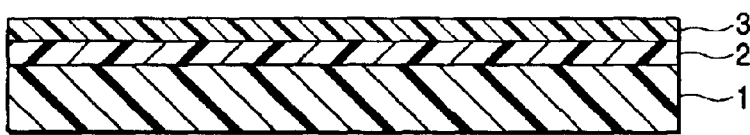

An undercladding layer 2 comprising, for example, a polyimide is formed on a substrate 1 as shown in FIG. 2A. A photosensitive polyamic acid resin composition is coated on the undercladding layer 2 and dried to form a photosensitive polyamic acid resin composition layer 3 as shown in FIG. 2B.

Figure 2C:
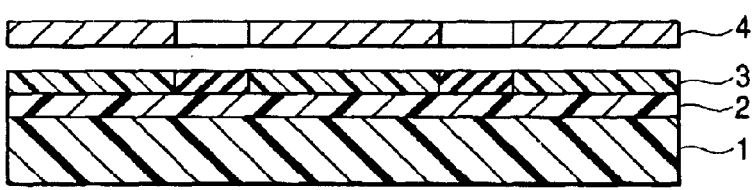

The photosensitive polyamic acid resin composition layer 3 is irradiated with UV light through a glass mask 4 so as to obtain a required pattern as shown in FIG. 2C. After irradiating the photosensitive polyamic acid resin composition layer 3 with UV light in such a manner, both exposed areas and unexposed areas are heated to imidate the photosensitive polyamic acid resin layer. Thus, the exposed areas complete photoreaction thereof to form a polyimide, whereas the unexposed areas form a polyimide that is inactive against UV light in the post step.

Figure 2D:
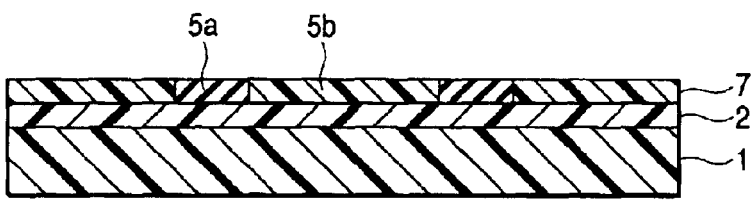
Figure 2E:
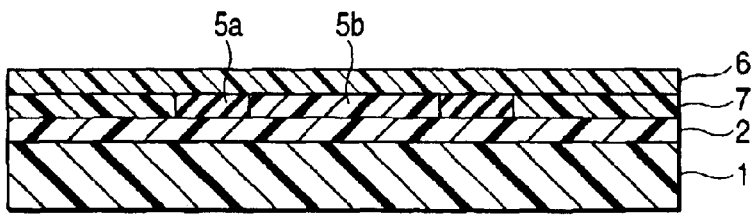

Thus, not only a core layer 5a is formed corresponding to the exposed areas, but also a clad 5b is formed corresponding to the unexposed areas, thereby obtaining a polyimide layer 7 having the core layer 5a and the clad 5b on the undercladding layer 2 as shown in FIG. 2D. Finally, an overcladding layer 6 is formed on the polyimide layer 7, thereby obtaining a channel type optical waveguide as shown in FIG. 2E.

A channel type flexible optical waveguide can also be prepared in the same manner as in the channel type optical waveguide. That is, first of all, an undercladding layer is formed on a substrate comprising a material that can be etched in the final step and can be peeled away from the undercladding layer in the same manner as in the above case of a channel type optical waveguide. Any material can be used as the substrate without particular limitation so far as such can meet the required characteristics described above. Examples of the substrate material include metals, inorganic materials, and organic films.

A photosensitive polyamic acid resin composition layer that gives a polyimide resin having a refractive index higher than the undercladding layer is formed on the undercladding layer. A region of the photosensitive polyamic acid resin composition layer corresponding to a required core pattern is irradiated with UV light through a glass mask so as to obtain a desired pattern, and then heated to imidate both UV light-exposed areas and UV light-unexposed areas, thereby forming a polyimide layer having a core layer comprising a polyimide corresponding to the UV light-exposed areas and a cladding layer comprising a polyimide of the UV light-unexposed areas in the same manner as in the production process of a channel type optical waveguide.

An overcladding layer comprising a material having a refractive index lower than the core layer is formed on the polyimide layer in the same manner as in the production process of a channel type optical waveguide. Thereafter, the substrate is removed by etching to obtain a flexible optical waveguide.

Production of an optical waveguide comprising a polycarbodiimide according to the invention will be described below.

For producing an optical waveguide comprising a polycarbodiimide, a 1,4-dihydropyridine derivative is compounded with a polycarbodiimide to prepare a photosensitive resin composition, a core layer and a cladding layer are formed on a substrate using this photosensitive resin composition, and an overcladding layer is further formed thereon.

Similar to the above photosensitive resin composition comprising a polyamic acid as the resin composition, the photosensitive resin composition comprising a polycarbodiimide as the resin composition comprises:

(i) 100 parts by weight of a polycarbodiimide; and (ii) from 0.01 to less than 10 parts by weight of a photosensitive compound comprising a 1,4-dihydropyridine compound represented by the above-described formula (I).

The polycarbodiimide is preferably represented by the following formula (III):

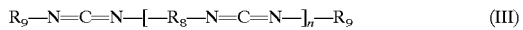

$$R_9-N=C=N-[-R_8-N=C=N-]_n-R_9 \quad (III)$$

wherein $R_8$ represents a diisocyanate residue; $R_9$ represents a monoisocyanate residue; and n represents an integer in a range of from 1 to 100.

For suppressing crystallization of the polymer, a copolymer comprising two kinds or more of different diisocyanates is usually used as the polycarbodiimide. Such a polycarbodiimide copolymer can be obtained by reacting two kinds or more of different diisocyanates in a reaction solvent in the presence of a carbodiimidating catalyst generally at a temperate in a range of from 0 to 150° C., and preferably from 10 to 120° C. (the temperature being, however, variable depending on a type of the diisocyanate used) to undergo carbodiimidation, and then preferably sealing the terminals by an aromatic monoisocyanate with high reactivity.

Sealing of the terminals by an aromatic monoisocyanate is preferably carried out by adding an aromatic monoisocyanate to the reaction mixture at an initial, middle or final stage or over the entire stage of carbodiimidation. End point of the reaction can be confirmed by observation of absorption (at 2,140 cm$^{-1}$) derived from a carbodiimide group and disappearance of absorption (at 2,280 cm$^{-1}$) derived from an isocyanate group according to the infrared light absorption spectral measurement.

In the polycarbodiimide represented by the above formula (III), $R_8$ represents a diisocyanate residue as described above. Examples of diisocyanates include hexamethylene diisocyanate, dodecamethylene diisocyanate, 2,2,4-trimethylhexamethylene diisocyanate, 4,4'-dicyclohexylmethane diisocyanate, xylylene diisocyanate, tetramethylxylylene diisocyanate, isophorone diisocyanate, cyclohexyl diisocyanate, lysine diisocyanate, methylcyclohexane-2,4-diisocyanate, 4,4'-diphenylmethane diisocyanate, 4,4'-diphenyl ether diisocyanate, 2,6-tolylene diisocyanate, 2,4-tolylene diisocyanate, naphthalene diisocyanate, 1-methoxyphenyl-2,4-diisocyanate, 3,3'-dimethoxy-4,4'-diphenylmethane diisocyanate, 4,4'-diphenyl ether diisocyanate, 3,3'-dimethyl-4,4'-diphenyl ether diisocyanate, 2,2-bis[4-(4-isocyanatophenoxy)phenyl]hexafluoropropane, and 2,2-bis[4-(4-isocyanatophenoxy)phenyl]propane.

Of those, tolylene diisocyanate, 4,4'-diphenylmethane diisocyanate, 1-naphthyl diisocyanate, hexamethylene diisocyanate, and dodecamethylene diisocyanate are especially preferably used. These diisocyanates may be used alone or in combination of two or more thereof.

In the polycarbodiimide represented by the above formula (III), $R_9$ represents a monoiscyanate residue used for sealing the terminals. Examples of monoisocyanates include phenylene isocyanate, p-nitrophenyl isocyanate, p-tolyl isocyanate, m-toyl isocyanate, p-formylphenyl isocyanate, p-isopropylphenyl isocyanate, and 1-naphthyl isocyanate. Especially, 1-naphthyl isocyanate that does not mutually react and can efficiently seal the terminals of polycarbodiimide is preferably used.

For sealing the terminals of polycarbodiimide, such a monoisocyanate is preferably used in an amount of from 1 to 10 parts by mole based on 100 parts by mole of the diisocyanate. When the amount of the monoisocyanate used is less than 1 part by mole, the molecular weight of the resulting polycarbodiimide is too high, or crosslinking reaction occurs, whereby viscosity increase or solidification of the resulting polycarbodiimide solution occurs. As a result, storage stability of the polycarbodiimide solution remarkably lowers. On the other hand, when the amount of the monoisocyanate used exceeds 10 parts by mole, since solution viscosity of the resulting polycarbodiimide solution is too low, film-forming property by coating deteriorates. That is, by sealing the terminals of polycarbodiimide using the monoisocyanate in an amount of from 1 to 10 parts by mole based on 100 parts by mole of the diisocyanate, it is possible to obtain a polycarbodiimide solution that is excellent in not only storage stability but also film-forming property.

In the case where an aliphatic diisocyanate and an aromatic diisocyanate are used as the diisocyanate and are react with each other in the presence of a carbodiimidating catalyst, the reaction temperature is preferably low. The reaction temperature is usually in the range of from 0 to 50° C., and preferably from 10 to 40° C. When the reaction temperature is higher than 50° C., reaction among the aromatic diisocyanates preferentially proceeds, and reaction of the aliphatic diisocyanate and the aromatic diisocyanate does not sufficiently proceed.

When the polycarbodiimide comprising an aliphatic diisocyanate and an aromatic diisocyanate is reacted with the aromatic diisocyanate present excessively in the reaction system in the presence of a carbodiimidating catalyst, the reaction temperature is usually in a range of from 40 to 150° C., and preferably from 50 to 120° C. When the reaction temperature is lower than 40° C., it needs an unnecessary period of time for progress of the reaction. On the other hand, when it exceeds 150° C., it is difficult to choose a reaction solvent.

In the carbodiimidation reaction of diisocyanates, the reaction solvent is preferably used such that a concentration of the diisocyanates is in the range of from 5 to 80% by weight. When this concentration is lower than 5% by weight, the carbodiimidation reaction may not proceed. On the other hand, when it exceeds 80% by weight, it may be difficult to control the reaction.

Organic solvents that are used in the carbodiimidation reaction of diisocyanates and organic solvents that are used during storing the resulting polycarbodiimide as a solution are not particularly limited so long as those are conventionally known to be suitable for such purposes. Examples of the organic solvents include halogenated hydrocarbons such as tetrachloroethylene, 1,2-dichloroethane, and chloroform; ketone based solvents such as acetone, methyl ethyl ketone, methyl isobutyl ketone, and cyclohexanone; cyclic ether based solvents such as tetrahydrofuran and dioxane; and aromatic hydrocarbon based solvents such as toluene and xylene. These solvents may be used alone or as a mixture of two or more thereof.

As the carbodiimidating catalyst, conventional phosphorus based catalysts are appropriately used. Examples of such phosphorus based catalysts include phospholene oxides such as 1-phenyl-2-phospholene-1-oxide, 3-methyl-2-phospholene-1-oxide, 1-ethyl-2-phospholene-1-oxide, 3-methyl-1-phenyl-2-phospholene-1-oxide, and 3-phospholene isomers thereof.

After completion of the carbodiimidation reaction, the resulting reaction mixture may be added to a poor solvent such as methanol, ethanol, isopropyl alcohol, and hexane to deposit a polycarbodiimide as a precipitate and remove unreacted diisocyanates or catalyst. The thus obtained polycarbodiimide is rinsed and dried according to the conventional manner, and then again dissolved in an appropriate solvent, thereby enhancing solution stability of the polycarbodiimide.

The polycarbodiimide can be purified by, for example, adsorbing undesired by-products contained in the polycarbodiimide solution on an appropriate adsorbent and removing them. Examples of adsorbents include alumina gel, silica gel, activated carbon, zeolite, activated magnetic magnesium, activate bauxite, activated clay, and molecular sieve carbon. These adsorbents may be used alone or in combination of two or more thereof.

The polycarbodiimide is suitably that n in the above formula (III) is in a range of from 1 to 100, i.e., the weight average molecular weight is in the range of from 200 to 20,000.

In the photosensitive polycarbodiimide resin composition comprising a polycarbodiimide as the resin component, the photosensitive compound is used in an amount of from 0.01 to less than 10 parts by weight, and preferably from 0.1 to 5 parts by weight, per 100 parts by weight of the polycarbodiimide. Similar to the case of the photosensitive polyamic acid resin composition, in the case where a photosensitive resin composition is prepared using the photosensitive compound in an amount of 10 parts by weight or more per 100 parts by weight of the polycarbodiimide, when the photosensitive resin composition is irradiated with UV light and heated, the polycarbodiimide causes light absorption in a near infrared region. On the other hand, in the case where the compounding amount of the photosensitive compound is less than 0.01 parts by weight per 100 parts by weight of the polycarbodiimide, when the photosensitive resin composition is irradiated with UV light and heated, the polycarbodiimide does not have a difference in refractive index sufficient such that an optical waveguide structure between exposed areas and unexposed areas can be formed.

The polycarbodiimide optical waveguide can be formed via from the first step to the fifth step in a manner exactly the same as in the formation of the polyimide optical waveguide, except that after irradiating the photosensitive polycarbodiimide resin composition with UV light and heating, an effective difference in refractive index is generated between UV light-exposed areas and UV light-unexposed areas by decomposed residues of the photosensitive compound and their amount, without generating any change of the polycarbodiimide itself, to form a core layer and a cladding layer.

Accordingly, the production of the polycarbodiimide optical waveguide will be briefly described below while omitting its detailed description.

After forming an undercladding layer on an appropriate substrate, the photosensitive polycarbodiimide resin composition is applied to the undercladding layer and dried to form a photosensitive polycarbodiimide composition layer; a region of the photosensitive polycarbodiimide resin composition layer corresponding to a required core pattern is irradiated with UV light through a mask to form UV light-exposed areas and UV light-unexposed areas corresponding to the core pattern in the photosensitive resin composition layer; both the UV light-exposed areas and the UV light-unexposed areas of the photosensitive resin composition layer are heated to form a polycarbodiimide layer containing a core layer comprising a polycarbodiimide of the UV light-exposed areas and a cladding layer comprising a polycarbodiimide of the UV light-unexposed areas; and an overcladding layer is further formed on the polycarbodiimide layer to obtain a polycarbodiimide optical waveguide.

In the case where an undercladding layer is formed, a polycarbodiimide layer containing a core layer and a cladding layer is formed on the undercladding layer, and an overcladding layer is further formed on the polycarbodiimide layer to form a channel type optical waveguide structure as described above, a refractive index of the cladding layer in the circumference of the core layer must be lower than that of the core layer. From the standpoint of contrast property, it is preferred that the refractive indexes of the circumferential clads are all identical. Accordingly, for example, the overcladding layer and the undercladding layer can be formed from the same polyimide.

In the case where the photosensitive polycarbodiimide resin composition is used as a photosensitive resin composition, the polycarbodiimide itself does not change even upon irradiation with UV light in the photosensitive polycarbodiimide resin composition, different from the case where the photosensitive polyamic acid resin composition is used. By irradiating the photosensitive polycarbodiimide resin composition with UV light, residual components of a decomposition product of the photosensitive compound remaining in the polycarbodiimide after the UV light irradiation and amounts thereof influence a refractive index of this resin layer after heating. That is, as described above, the photosensitive compound in unexposed areas volatilizes at a temperature of, for example, about 200° C., whereas the photosensitive compound in exposed areas merely partially volatilizes even at a temperature of, for example, about 300° C. Thus, during heating carried out after irradiating the photosensitive polycarbodiimide resin composition layer with UV light, the residual amount of the decomposition product of the photosensitive compound in the polycarbodiimide after heating can be adjusted by regulating the heating temperature or temperature elevation rate. As a result, a desired difference in refractive index between the exposed areas and the unexposed areas can be obtained.

As described above, it is possible to adjust a difference in refractive index after heating exposed areas and unexposed areas of the resulting photosensitive polycarbodiimide resin composition by adjusting the amount of the photosensitive compound compounded with the polycarbodiimide in a range of from 0.01 to less than 10 parts by weight. That is, the higher the amount of the photosensitive compound compounded with the polycarbodiimide, the larger the refractive index of the exposed areas after heating is. Further, since easiness of volatilization of the residual photosensitive compound (decomposition product) of the exposed areas differs from easiness of volatilization of the residual photosensitive compound (decomposition product) of the unexposed areas, it is possible to make those have a difference in the residual amount from each other by changing the heat profile in the heating step. As a result, it is possible to have an effective difference in refractive index. Heating temperature after irradiating the photosensitive polycarbodiimide resin composition with UV light is generally in a range of from 100 to 300° C.

Both the UV light-exposed areas and the UV light-unexposed areas of the photosensitive polycarbodiimide resin composition layer are heated to form a polycarbodiimide layer comprising a core layer comprising a polycarbodiimide of UV light-exposed areas and a cladding layer comprising a polycarbodiimide of UV light-unexposed areas corresponding to the core pattern. By thus forming a core layer and a cladding layer according to the invention, the core layer has a refractive index higher than that of the cladding layer.

Thus, according to the invention, a region of the photosensitive polycarbodiimide resin composition corresponding to the core pattern is irradiated with UV light and heated together with the UV light-unexposed areas. That is, since the UV light-unexposed areas are heated as they are without being removed, together with the UV light-exposed areas, a difference in level by the core layer as in the conventional wet process is not formed, but the polycarbodiimide layer having a core layer and a cladding layer has a flat surface.

In the case where the photosensitive polycarbodiimide resin composition is used as the photosensitive resin composition, the overcladding layer on the polycarbodiimide layer containing a core layer and a cladding layer may be formed from a polycarbodiimide in a conventional manner as in the case of the undercladding layer. The polycarbodiimide used and its method are not particularly limited. However, the photosensitive polycarbodiimide resin composition may be applied to the substrate and dried, and then heated as it is without being exposed, to form the undercladding layer.

When the UV light-unexposed areas of the photosensitive polycarbodiimide resin composition layer are heated, the photosensitive compound is heat decomposed, and the decomposition product is fixed in the resin by removal of the solvent from the layer, whereby reactivity as the photosensitive compound is lost. Thus, in the post step, whatever a cladding layer formed corresponding to the UV light-unexposed areas is irradiated with UV light, this cladding layer is inactive against UV light. This point is different from that in conventional resists.

For making the circumference of the core, i.e., a clad, uniform, it is practically advantageous for the overcladding layer formed on the polycarbodiimide layer as a primary layer having an undercladding layer and a core layer to use the same material as in the core layer. That is, the same photosensitive polycarbodiimide resin composition may be used for all of the core layer and the cladding layers, and only a region where a core pattern is formed is irradiated with UV light and then heated. However, if desired, resins other than polycarbodiimides, such as epoxy resins and polycarbonate resins, can be used for the overcladding layer.

As described above, it is necessary in the optical waveguide that the refractive index of the core layer be higher than that of the cladding layer. Usually, a relative refractive index difference Δ therebetween may be sufficient as from about 0.2 to 1.0% in the case of a single mode. Here, the refractive index difference Δ is expressed by the following equation:

$$\Delta=((n(\text{core})-n(\text{clad}))/n(\text{core}))\times100(\%)$$

wherein "n(core)" represents a refractive index of the core layer, and "n(clad)" represents a refractive index of the cladding layer. For example, in the case of preparing a single mode waveguide, the core layer and the cladding layer may be made to have a difference in refractive index of from about 0.2 to 1.0%.

Examples of the optical waveguide include straight optical waveguides, bend multilayered optical waveguides, crossing optical waveguides, Y-branched optical waveguides, slab optical waveguides, Mach-Zehnder type optical waveguides, AWG type optical waveguides, grating optical waveguides, and optical waveguide lenses. Examples of optical elements using such an optical waveguide include wavelength filters, optical switches, optical branch units, optical multiplexers, optical multiplexers/demultiplexers, optical amplifiers, wavelength modulators, wavelength division multiplexers, optical splitters, directional couplers, and optical transmission modules having a laser diode or a photodiode hybrid integrated therewith.

As described above, according to the invention, a photosensitive resin composition layer is formed on an undercladding layer, a region of the photosensitive resin composition corresponding to a required pattern is irradiated with UV light, and UV light-exposed areas and UV light-unexposed areas are simultaneously heated to form a resin layer containing a core layer and a cladding layer. Consequently, according to such a method, after irradiating the photosensitive resin composition layer with UV light, the core layer can be obtained without undergoing development. Thus, not only the step can be made simple, but also various inconveniences following the development can be avoided. That is, since the invention is made free from problems in the conventional process such as development scattering caused during development of a photosensitive resin composition after exposure, it is possible to markedly enhance yield in pattern formation.

Further, according to the invention, since the resin layer containing a core layer and a cladding layer is simultaneously formed, a difference in level by the core layer as in the conventional wet process is not formed. Thus, the core layer and the cladding layer simultaneously formed comprise a resin having a flat surface. Accordingly, during forming an overcladding layer on the resin layer, it is not necessary to form an overcladding layer by making a difference in level formed by the core layer uniform. Thus, it is possible to easily form an overcladding layer having a flat surface without inconveniences such as incorporation of bubbles in the difference in level.

Moreover, according to the invention, a 1,4-dihydropyridine derivative as a photosensitive compound is compounded with a resin to form a photosensitive resin composition, and the photosensitive resin composition is irradiated with UV light and then heated to form an effective difference in refractive index between a resin layer of UV light-exposed areas and a resin layer of UV light-unexposed areas by residual components of a decomposition product of the photosensitive compound in the resin layer and amount thereof, thereby simultaneously forming a core layer and a cladding layer. Thus, according to the invention, the resin used is not particularly restricted.

The invention will be described in detail below with reference to the following Examples, but it should be understood that the invention is not construed as being limited thereto.

EXAMPLE 1

In a 500 ml separable flask, 16.0 g (0.05 moles) of 2,2'-bis(trifluoromethyl)-4,4'-diaminobiphenyl (TFMB) was dissolved in 152.8 g of N,N-dimethylacetamide (DMAc) in a nitrogen atmosphere. 22.2 g (0.05 moles) of 2,2-bis(3,4-dicarboxyphenyl)hexafluoropropane dianhydride (6FDA) was added to this solution with stirring, and the resulting mixture was additionally stirred at room temperature for 24 hours to prepare a polyamic acid solution.

0.38 g (1.0 part by weight per 100 parts by weight of the polyamic acid (solids content) in the polyamic acid solution) of a photosensitive compound (EDHP) was added to this polyamic acid solution to obtain a photosensitive polyimide resin precursor composition as a solution.

The photosensitive polyimide resin precursor composition was applied to a synthetic quartz substrate having a thickness of 1.0 mm by spin coating, dried at 90° C. for about 15 minutes, and then heated in vacuo at 38° C. for 2 hours, thereby imidating the polyamic acid. The thus obtained polyimide had a film thickness of 10 μm. The polyimide film was used as an undercladding layer.

The photosensitive polyamic acid solution was applied to this undercladding layer by spin coating and dried at 90° C. for about 15 minutes to form a polyimide resin precursor composition layer. On this layer, a glass mask on which a 70 mm-long pattern having a line width of 8 μm was drawn at a pitch of 50 μm was placed and irradiated with UV light of 10 mJ/m² from the upper side to obtain a pattern of a core layer of optical waveguide comprising a prescribed pattern. The core layer was heated in vacuo at 360° C. for 2 hours to complete imidation of the polyamic acid, thereby obtaining a core pattern and a clad. The core pattern and the clad each had a thickness of 7 μm.

The photosensitive polyimide resin precursor composition was further applied to the clad by spin coating and then heated in vacuo at 380° C. for 2 hours to form an overcladding layer having a thickness of 20 μm. Thus, a channel type optical waveguide was obtained. The optical waveguide was evaluated for propagation loss at a wavelength of 1.55 μm by the cut-back method. As a result, the optical waveguide had a propagation loss of 1.2 dB/cm.

EXAMPLE 2

In a 500 ml separable flask, 11.0 g (0.05 moles) of 2,2'-difluorobenzidine (FBZ) was dissolved in 132.8 g of N,N-dimethylacetamide (DMAc) in a nitrogen atmosphere. 22.2 g (0.05 moles) of 2,2-bis(3,4-dicarboxyphenyl) hexafluoropropane dianhydride (6FDA) was added to this solution with stirring, and the resulting mixture was additionally stirred at room temperature for 24 hours to prepare a polyamic acid solution.

0.66 g (2.0 parts by weight per 100 parts by weight of the polyamic acid (solids content) in the polyamic acid solution) of a photosensitive compound (EDHP) was added to this polyamic acid solution to obtain a photosensitive polyimide resin precursor composition as a solution.

The photosensitive polyimide resin precursor composition was applied to a substrate comprising a copper foil having a thickness of 0.1 mm by spin coating, dried at 90° C. for about 15 minutes, and then heated in vacuo at 380° C. for 2 hours, thereby imidating the polyamic acid. The thus obtained polyimide had a film thickness of 10 μm. The polyimide film was used as an undercladding layer.

The photosensitive polyamic acid solution was applied to this undercladding layer by spin coating and dried at 90° C. for about 15 minutes to form a polyimide resin precursor composition layer. On this layer, a glass mask on which a 70 mm-long pattern having a line width of 8 μm was drawn at a pitch of 50 μm was placed and irradiated with UV light of 10 mJ/m² from the upper side to obtain a pattern of a core layer of optical waveguide comprising a prescribed pattern. The core layer was heated in vacuo at 360° C. for 2 hours to complete imidation of the polyamic acid, thereby obtaining a core pattern and a clad. The core pattern and the clad each had a thickness of 7 μm.

The photosensitive polyimide resin precursor composition was further applied to the clad by spin coating and then heated in vacuo at 380° C. for 2 hours to form an overcladding layer having a thickness of 10 μm. The copper foil was removed by the conventional etching method using a ferric chloride/hydrochloric acid solution to obtain a channel type flexible optical waveguide having a total thickness of 27 μm. The optical waveguide was evaluated for propagation loss in the same manner as in Example 1. As a result, the optical waveguide had a propagation loss of 1.5 dB/cm.

EXAMPLE 3

A channel type optical waveguide was obtained in the same manner as in Example 1, except that the undercladding layer and the overcladding layer were formed using the polyamic acid solution prepared in Example 1. The optical waveguide was evaluated for propagation loss in the same manner as in Example 1. As a result, the optical waveguide had a propagation loss of 1.0 dB/cm.

EXAMPLE 4

500 ml four-necked flask equipped with a stirrer, a dropping funnel, a reflux condenser and a thermometer was charged with 29.89 g (171.6 mmoles) of tolylene diisocyanate (T-80: an isomer mixture manufactured by Mitsui Takeda Chemicals, Inc.), 94.48 g (377.52 mmoles) of 4,4'-diphenylmethane diisocyanate, 64.92 g (308.88 mmoles) of naphthalene diisocyanate, and 184.59 g of toluene in a nitrogen gas stream. 8.71 g (51.48 mmoles) of 1-naphthyl isocyanate and 0.82 g (4.29 mmoles) of 3-methyl-1-phenyl-2-phospholene-2-oxide were further added to the resulting mixture, and the temperature was elevated at 100° C. while stirring in a nitrogen gas stream. The mixture was maintained at the same temperature for 2 hours. Progress of the reaction was confirmed by infrared spectroscopy using FT-IR-230 manufactured by JEOL Ltd. That is, reduction of absorption of N—C—O stretching vibration (at 2,270 cm$^{-1}$)

of the isocyanate group and increase of absorption of N-C-N stretching (at 2,135 cm$^{-1}$) of carbodiimide were observed. End point of the reaction was confirmed by infrared spectroscopy, and the resulting reaction mixture was cooled to room temperature to obtain a polycarbodiimide solution. This polycarbodiimide had a weight average molecular weight of 8,000 (an average number of n: 40).

A photosensitive compound (EDHP) was added to this polycarbodiimide solution in an amount of 1.0 part by weight per 100 parts by weight of the polycarbodiimide to obtain a photosensitive resin composition as a solution.

The photosensitive polycarbodiimide solution was applied to a synthetic quartz substrate having a thickness of 1.0 mm by spin coating, dried at 90° C. for about 15 minutes, and then heated in vacuo at 300° C. for 2 hours. The thus obtained polycarbodiimide had a film thickness of 10 μm. The polycarbodiimide film was used as an undercladding layer.

The photosensitive polycarbodiimide solution was applied to this undercladding layer by spin coating and dried at 90° C. for about 15 minutes to form a polycarbodiimide layer. On this layer, a glass mask on which a 70 mm-long pattern having a line width of 8 μm was drawn at a pitch of 50 μm was placed and irradiated with UV light of 10 mJ/m$^2$ from the upper side to obtain a pattern of a core layer of optical waveguide comprising a prescribed pattern. The core layer was heated in vacuo at 300° C. for 2 hours to obtain a core pattern and a clad. The core pattern and the clad each had a thickness of 10 μm.

The photosensitive polycarbodiimide solution was further applied to the clad by spin coating and then heated in vacuo at 300° C. for 2 hours to form an overcladding layer having a thickness of 10 μm. Thus, a channel type optical waveguide was obtained. The optical waveguide was evaluated for propagation loss at a wavelength of 1.55 μm by the cut-back method. As a result, the optical waveguide had a propagation loss of 1.1 dB/cm.

EXAMPLE 5

500 ml four-necked flask equipped with a stirrer, a dropping funnel, a reflux condenser and a thermometer was charged with 89.01 g (355.68 mmoles) of 4,4'-diphenylmethane diisocyanate, 24.92 g (118.56 mmoles) of naphthalene diisocyanate, 44.87 g (266.76 mmoles) of hexamethylene diisocyanate, and 216.56 g of toluene in a nitrogen gas stream. 7.52 g (44.46 mmoles) of 1-naphthyl isocyanate and 0.71 g (3.705 mmoles) of 3-methyl-1-phenyl-2-phospholene-2-oxide were further added to the mixture. The resulting mixture was stirred at 25° C. for 3 hours, and the temperature was then elevated at 100° C. while stirring. The mixture was maintained at the same temperature for 2 hours. Progress of the reaction was confirmed by infrared spectroscopy using FT-IR-230 manufactured by JEOL Ltd. That is, reduction of absorption of N—C—O stretching vibration (at 2,280 cm$^{-1}$) of the isocyanate group and increase of absorption of N—C—N stretching (at 2,140 cm$^{-1}$) of carbodiimide were observed. End point of the reaction was confirmed by infrared spectroscopy, and the resulting reaction mixture was cooled to room temperature to obtain a polycarbodiimide solution. This polycarbodiimide had a weight average molecular weight of 8,000 (an average number of n: 40).

A photosensitive compound (EDHP) was added to this polycarbodiimide solution in an amount of 1.0 part by weight per 100 parts by weight of the polycarbodiimide to obtain a photosensitive resin composition as a solution.

Using this photosensitive resin composition solution, a channel type optical waveguide was obtained in the same manner as in Example 1. The optical waveguide was evaluated for propagation loss at a wavelength of 1.55 μm by the cut-back method. As a result, the optical waveguide had a propagation loss of 1.1 dB/cm.

It should further be apparent to those skilled in the art that various changes in form and detail of the invention as shown and described above may be made. It is intended that such changes be included within the spirit and scope of the claims appended hereto.

This application is based on Japanese Patent Application No. 2002-208428 filed Jul. 17, 2002 and No. 2003-059233 filed Mar. 5, 2003, the disclosures of which are incorporated herein by reference in their entireties.

What is claimed is:

1. A process of producing a polymer optical waveguide, which comprises:
   (a) a step of forming an undercladding layer on a substrate;
   (b) a step of forming a photosensitive resin composition layer containing a 1,4-dihydropyridine derivative and a resin on the undercladding layer;
   (c) a step of irradiating a region of the photosensitive resin composition layer corresponding to a core pattern with UV light through a mask to form UV light-exposed areas and UV light-unexposed areas on the photosensitive resin composition layer;
   (d) a step of heating the UV light-exposed areas and UV light-unexposed areas of the photosensitive resin composition layer; and
   (e) a step of forming an overcladding layer on the photosensitive resin composition layer after heating.

2. The process as claimed in claim 1, wherein the photosensitive resin composition contains 0.01 to less than 10 parts by weight, per 100 parts by weight of the resin, of the 1,4-dihydropyridine derivative.

3. The process as claimed in claim 1, wherein the resin is a polyamic acid.

4. The process as claimed in claim 1, wherein the resin is a polycarbodiimide.

5. The process as claimed in claim 1, wherein the 1,4-dihydropyridine derivative is represented by the following formula (I):

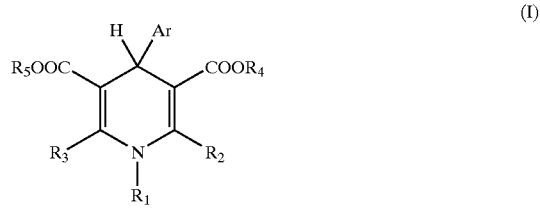

wherein Ar represents an aromatic having a nitro group at the ortho-position with respect to the bonding position to the 1,4-dihydropyridine ring; $R_1$ represents a hydrogen atom or an alkyl group having from 1 to 3 carbon atoms; and $R_2$, $R_3$, $R_4$, and $R_5$ each independently represent a hydrogen atom or an alkyl group having 1 or 2 carbon atoms.

* * * * *